United States Patent [19]

Makinouchi et al.

[11] Patent Number: 4,958,082
[45] Date of Patent: Sep. 18, 1990

[54] POSITION MEASURING APPARATUS

[75] Inventors: Susumu Makinouchi; Toshikazu Umatate, both of Kawasaki, Japan

[73] Assignee: Nikon Corporation, Tokyo, Japan

[21] Appl. No.: 236,206

[22] Filed: Aug. 25, 1988

[30] Foreign Application Priority Data

Aug. 31, 1987 [JP]  Japan .................................. 62-217261

[51] Int. Cl.$^5$ ............................................ G01N 21/86
[52] U.S. Cl. ...................................... 250/548; 355/43; 355/58
[58] Field of Search ...................... 355/43, 53; 250/548

[56] References Cited

U.S. PATENT DOCUMENTS

| | | | |
|---|---|---|---|
| 4,629,313 | 12/1986 | Tanimoto | 355/53 |
| 4,677,301 | 6/1987 | Tanimoto et al. | 250/548 |
| 4,739,373 | 4/1988 | Nishi et al. | 355/43 |
| 4,748,478 | 5/1988 | Suwa et al. | 355/43 |
| 4,794,426 | 12/1988 | Nishi | 355/43 |
| 4,803,524 | 2/1989 | Ohno et al. | 355/53 |
| 4,814,829 | 3/1989 | Kosugi et al. | 355/53 |

Primary Examiner—Léon Scott, Jr.
Attorney, Agent, or Firm—Shapiro & Shapiro

[57] ABSTRACT

An exposure apparatus for exposing a pattern on a substrate to be exposed having a predetermined mark formed thereon includes a stage for supporting the substrate to be exposed thereon, moving means capable of moving the stage in a direction along a predetermined surface, mark detecting means for applying a light beam to the substrate to be exposed and detecting the predetermined mark, position detecting means outputting a position signal conforming to the position of the stage on the predetermined surface, producing means for detecting information regarding rotation of the stage along the predetermined surface and producing an information signal, and correcting means for correcting on the basis of the information signal the position signal when the mark detecting means detects the predetermined mark.

18 Claims, 6 Drawing Sheets

POSITION MEASURING APPARATUS

BACKGROUND OF THE INVENTION

1. Field of the Invention

This invention relates to a position measuring apparatus using a precise positioning apparatus, and in particular to an apparatus for detecting a mark provided on a substrate which is an object to be positioned and measuring the position of the substrate.

2. Related Background Art

As an apparatus for two-dimensionally positioning a substrate such as a semiconductor wafer or liquid crystal, there is known a step-and-repeat type projection exposure apparatus. The apparatus of this type is such that a pattern formed on a reticle is projected onto a wafer by a projection lens and only a local area on the wafer is exposed, whereafter the wafer is caused to effect stepping to expose an adjacent local area. For this reason, the wafer is placed on a two-dimensionally moved stage. Now, usually, the wafer is exposed with several layers of circuit patterns being superposed thereon and therefore, it becomes necessary to align the reticle and the local area on the wafer. Several methods of alignment have been put into practical use and used in the field of the manufacture of semiconductors. As one of such alignment systems, it is known to use an apparatus disclosed, for example, in U.S. Pat. No. 4,677,301. FIGS. 1A and 1B of the accompanying drawings illustrate an alignment system using a prior-art apparatus. In FIG. 1A, a wafer 8 is placed on a two-dimensionally moved stage 1, and the position of the stage 1 is sequentially measured by a laser light wave interference type measuring machine 2 (hereinafter referred to as the interferometer) with a resolving power of the order of 0.02 $\mu$m. A fiducial mark 5 of the same shape as a mark WM preformed on the wafer 8 is fixed on the stage 1. A reticle 4 having a pattern to be exposed is set at a predetermined location above a projection lens 3. The projection lens 3 serves to project the pattern of the reticle 4 onto the photoresist layer of the wafer 8.

Now, in this apparatus, there are provided two alignment systems, one of which is a TTL alignment system for detecting the mark WM or the fiducial mark 5 of the wafer 8 from between the reticle 4 and the projection lens 3 through the projection lens 3 and the other is a TTR (through the reticle) alignment system 10 for detecting a mark RM provided on the reticle 4 and the fiducial mark 5 at a time. The TTL alignment system has a laser light transmitting system 7 for outputting a laser light (He-Ne or the like) for alignment and forming a sheet-like beam on the wafer 8 or on the fiducial mark 5, and a light-receiving system 6 for detecting light information from the mark. This light-receiving system 6, with the interferometer 2, is used for the detection of the position of the mark. The details of this mark detecting operation are disclosed in the aforementioned U.S. Patent and therefore need not be described herein.

In such a construction, the stage 1 is first moved, and then is positioned so that the fiducial mark 5 and the mark RM of the reticle 4 are detected in a predetermined positional relation by the TTR alignment system 10. The position of the stage 1 when this positioning is completed is detected by the interferometer 2.

Subsequently, the stage 1 is moved so that the fiducial mark 5 is scanned relative to the sheet-like beam from the laser light transmitting system 7 of the TTL alignment system, and at this time, the light information from the fiducial mark 5 is detected by the light-receiving system 6, and the position of the stage 1 in which the sheet-like beam and the fiducial mark 5 coincide accurately with each other is detected by the interferometer 2. The stage 1 is further moved, and then is positioned at a position in which the mark WM of the wafer 8 is detected by the sheet-like beam of the TTL alignment system as shown in FIG. 1B. Likewise, the position of the stage 1 when the mark WM and the sheet-like beam have accurately coincided with each other is detected by the light-receiving system 6 and the interferometer 2.

The relative positional relation between the reticle 4 and the fiducial mark 5 and the relative positional relation between the fiducial mark 5 and the wafer 8 are found by the above-described operation, and after all, the relative position of the reticle 4 and the wafer 8 is indirectly found.

Accordingly, during the actual exposure of the step-and-repeat type, the wafer 8 can be aligned at a predetermined superposition exposure position on the basis of only the position information of the interferometer 2.

In the above-described prior-art system, the position of the wafer 8 relative to the reticle 4 is detected through the operation of measuring the position of the stage 1 and therefore, when yawing occurs to the stage 1, there arises the problem that an error is included in the position detection. Yawing means the rotation of the stage 1 on a two-dimensional coordinates system by the x-axis and the y-axis. The prior-art interferometer 2 only measures the coordinates value of the stage 1 along the x-axis and the y-axis orthogonal to each other and therefore, even if a minute rotational deviation occurred to the stage 1 in a plane containing the x-axis and the y-axis, it could not detect the minute rotational deviation. This has led to the problem that when the amount of yawing differs due to the difference in the position of the stage 1 between during the detection of the fiducial mark 5 and during the detection of the mark WM of the wafer, a so-called Abbe error occurs.

SUMMARY OF THE INVENTION

It is an object of the present invention to provide an apparatus for measuring position of moving means such as a stage highly accurately even if there is yawing of the moving means.

To achieve the above object, the present invention is constructed so that the data regarding the amount of yawing of the moving means such as the stage is measured and the data of the detected position of an object to be detected such as a substrate or a mark is corrected on the basis of the measured information.

DESCRIPTION OF THE PREFERRED EMBODIMENTS

Figure 2A:
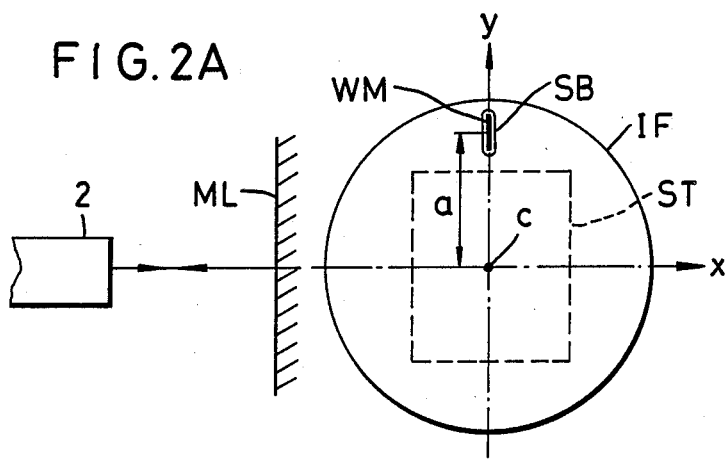
FIGS. 2A and 2B illustrate the principle of the present invention.
Figure 2B:
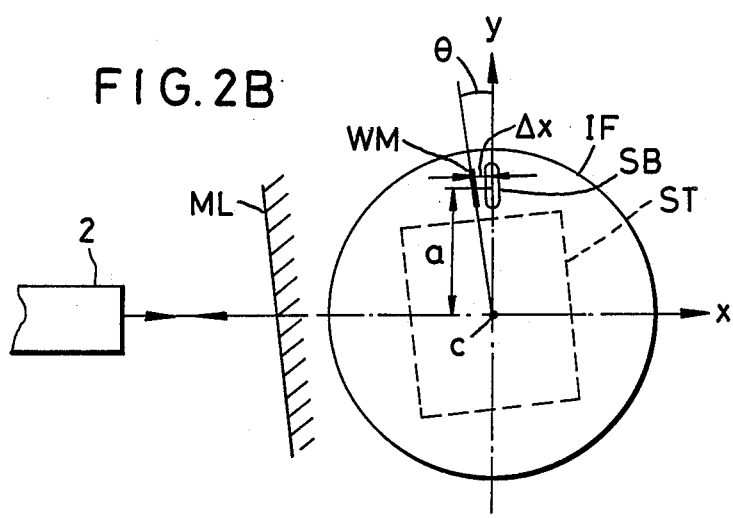

FIGS. 2A and 2B illustrate the principle of the present invention. FIG. 2A shows a case where the yawing of a stage is zero. The circular area represents the image field IF of a projection lens, and the center c is a point at which the optic axis of the projection lens is orthogonal to the y-axis and x-axis of the coordinates system. The sheetlike beam SB of a TTL alignment system is positioned on the y-axis in the image field IF and is determined so as to be spaced apart by a from the center c. The sheet-like beam SB extends in the form of a slit in y direction and detects a mark extending in y direction on a wafer. The rectangular area ST represents the stage as converted into a rectangle of a size corresponding to one chip (one shot) for the sake of illustration. ML designates a moving mirror for an interferometer 2 fixed to the stage. The moving mirror ML is adapted to be substantially orthogonal to the x-axis when no yawing occurs to the stage 1. In contrast with FIG. 2A, the entire stage rotates by an angle $\theta$ relative to the absolute stationary coordinates system xy when yawing occurs to the stage as shown in FIG. 2B.

In FIG. 2B, the angle $\theta$ is exaggeratedly represented for the sake of illustration, but the actual amount thereof is within a range in which the length measuring beam from the interferometer 2 correctly returns from the moving mirror ML, and is very small. Now, when a mark WM on a wafer is scanned in x direction by the sheet-like beam SB, rotation by the angle $\theta$ occurs due to yawing and the position is detected including an error of $\Delta x$ in x direction relative to the true mark coordinates position.

So, if the amount of yawing $\theta$ can be measured, the error $\Delta x$ can be easily found from the relation that $$\Delta x \approx a \sin \theta \tag{1}$$

Here, a is a constant and therefore, simply by measuring the angle $\theta$ created during the mark detecting operation, $\Delta x$ can be calculated and the mark can be corrected to the true mark position.

Figure 1A:
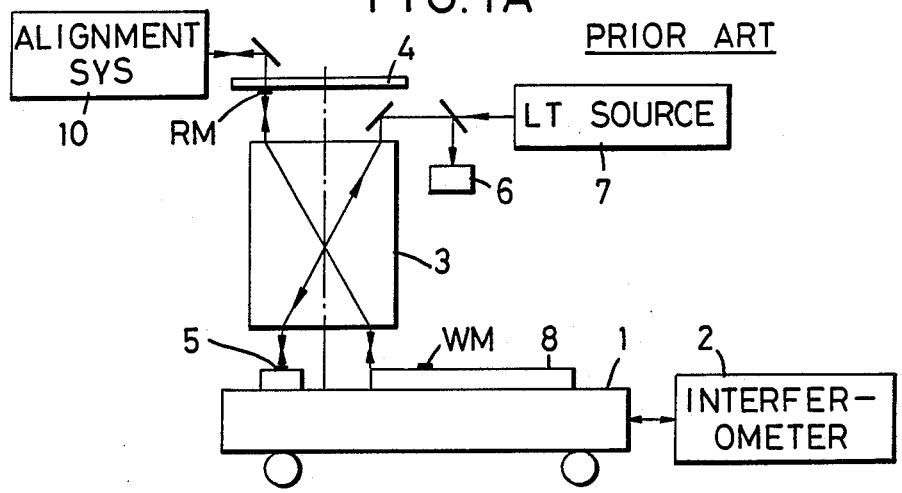
FIGS. 1A and 1B illustrate the prior art.
Figure 1B:
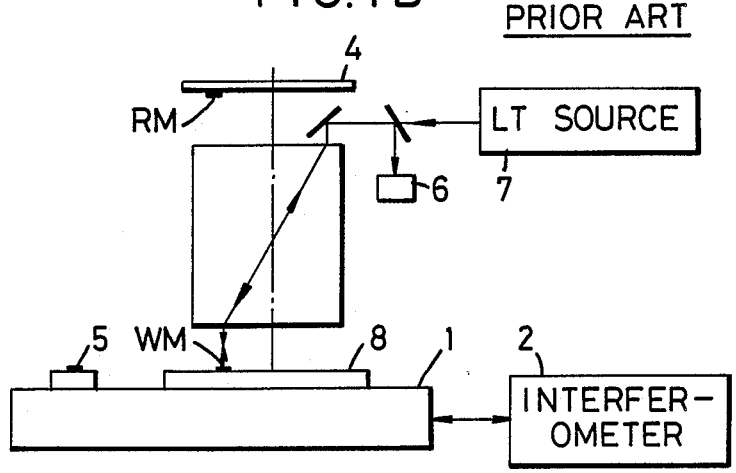
Figure 3:
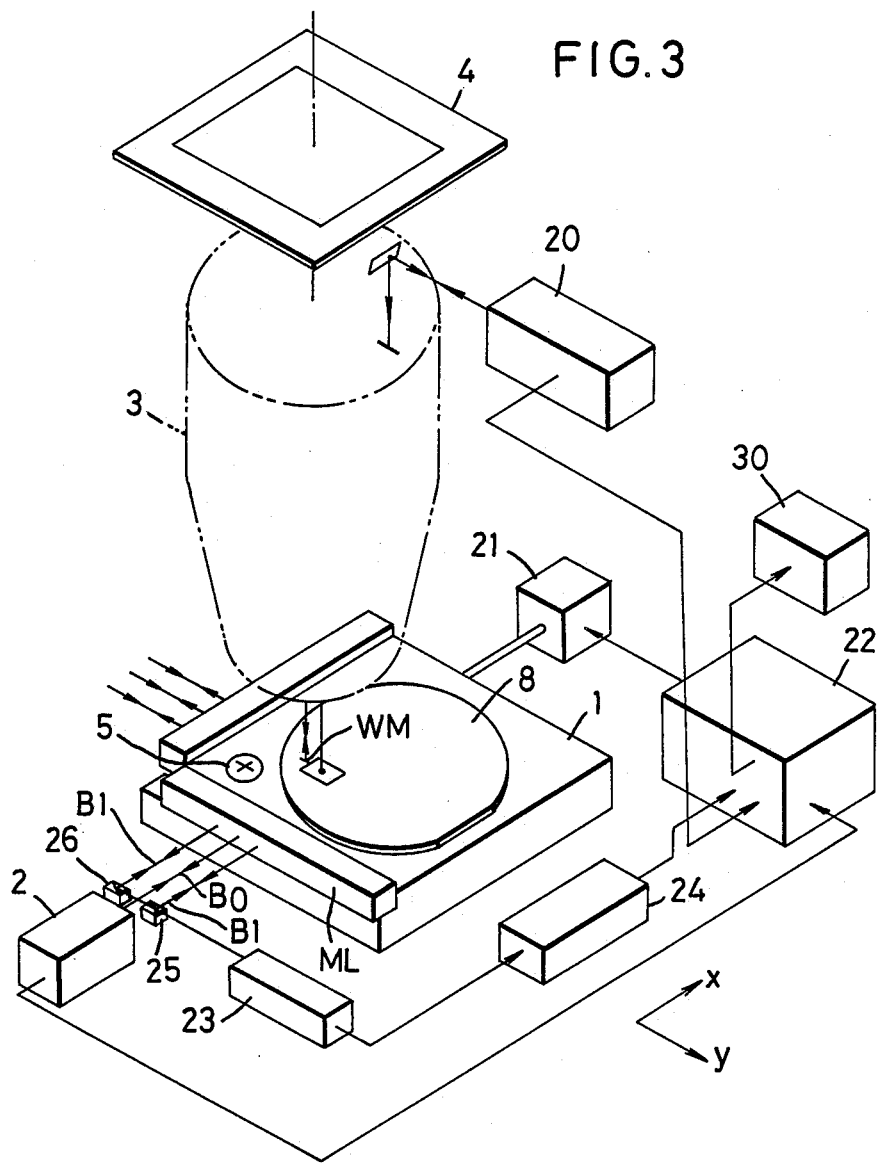
FIG. 3 schematically illustrates the apparatus of the present invention.

FIG. 3 is a perspective view showing the construction of a projection type exposure apparatus (stepper) in which the position detecting apparatus according to an embodiment of the present invention is used. In FIG. 3, members similar to those described with reference to FIG. 1 are given similar reference numerals.

In FIG. 3, the TTR alignment system 10 is not shown, and a TTL alignment system comprising a laser light transmitting system 7 and a light receiving system 6 is designated by 20. The moving mirror ML is fixed to the two orthogonal sides of the stage 1, and a length measuring beam $B_0$ from the interferometer 2 enters the moving mirror ML. Two parallel laser beams $B_1$ with the beam $B_0$ interposed therebetween enter the moving mirror ML from a yawing measuring interferometer 23 through a mirror 26 and a beam splitter 25, etc. The two beams $B_1$ are spaced apart from each other by a predetermined spacing $d_1$ in y direction, and the difference $d_2$ in the optical path length between the two beams (the distance from the interferometer 23 to the reflecting surface ML of the stage 1) is directly measured by the interferometer 23. The interferometer 23 causes the two beams $B_1$ to interfere with each other, thereby accomplishing measurement.

The reflecting surface of the moving mirror ML originally extends parallel to the y-axis, but when yawing occurs to the stage 1, the parallelism of the reflecting surface to the y-axis breaks correspondingly thereto. The amount of inclination (rotation) of the reflecting mirror is measured by the interferometer 23. The detection sensitivity of the amount of yawing becomes higher when the spacing (span) in y direction between the two laser beams $B_1$ is greater, but the moving mirror ML must be made correspondingly longer in y direction. Accordingly, the spacing between the two beams $B_1$ is determined in conformity with the detection resolution of the interferometer 23, the required measurement resolution of yawing and the movement stroke of the stage 1. Now, the value measured by the interferometer 23 does not directly represent the amount of yawing (the angle $\theta$) and therefore, it is converted into the amount of yawing by an operator 24. More specifically, it is calculated from the distance $d_1$ between the two beams $B_1$ and the difference $d_2$ between the distances measured by the two beams $B_1$, by the following equation (2):

$$\theta = \tan^{-1}\left(\frac{d_2}{d_1}\right) \tag{2}$$

The data of the amount of yawing thus found is supplied to a main control system 22, where the data is used for the correction of the detected mark position. The main control system 22 calculates the true mark position on the basis of the coordinates data from the interferometer 2, the mark information from the TTL alignment system 20 and the aforementioned correction equation. Also, the main control system 22 controls a motor 21 for moving the stage 1 and outputs a warning to a display device (the terminal of a computer or the like) 30 for displaying that the fluctuation range of the amount of yawing has exceeded the tolerance.

In FIG. 3, the TTL alignment system 20 is used to detect the mark WM for x direction on the wafer 8, and another such system is provided at the disposition of 90° to detect a mark for y direction. Further, an interferometer for measuring the length in y direction, a motor for y direction, etc. are likewise provided.

Operation of the present embodiment will now be described. As previously described in connection with FIGS. 2A and 2B, the mark WM or fiducial mark 5 provided at a predetermined location on the wafer 8 is scanned relative to the sheet-like beam from the TTL alignment system 20. Therefore, the stage 1 is moved within a predetermined range in x direction. However, it is to be understood that the position of the wafer 8 relative to the sheet-like beam is prescribed with the accuracy of 1 $\mu$m or less by wafer global alignment effected beforehand.

Figure 5:
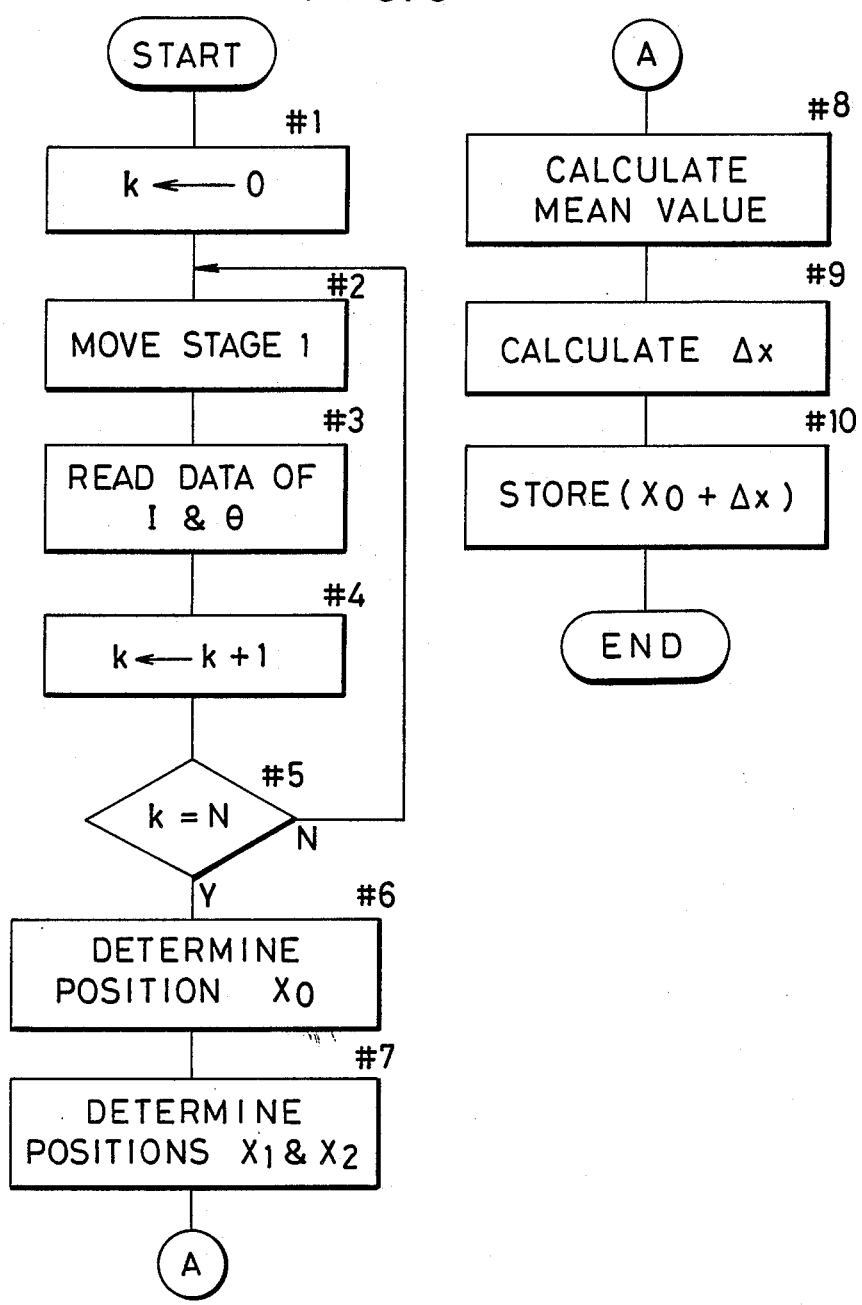
FIG. 5 is a flow chart illustrating the operation of an embodiment of the present invention.

Operation of the embodiment of the present invention will hereinafter be described with reference to the flow chart of FIG. 5.

First, at step #1, the main control system 22 increments the content k of an internal counter therein. In the case of the present embodiment, the sheet-like beam SB is stationary in the coordinates system xy and therefore, the scanning range of the mark WM is determined for the beam SB. This scanning range may be a distance at which the mark WM can be reliably grasped, for example, a very short distance of the order of 30-100μm.

Now, at step #2, the stage 1 is moved by a predetermined amount in x direction. At step #3, the main control system 22 reads the intensity of light I and the information (angle 0) corresponding to the amount of yawing through the interferometer 23 and the operator 24, and stores them in the internal memory therein. At step #4, the content of the internal counter is incremented by 1. The operations of steps #2–#4 are repetitively performed until the content of the internal counter reaches N. When at step #5, k=N, shift is made to step #6. By the above-described operations, the main control system 22 reads the data regarding I and 0 in succession for each predetermined amount of movement of the stage 1 in x direction.

Figure 4A:
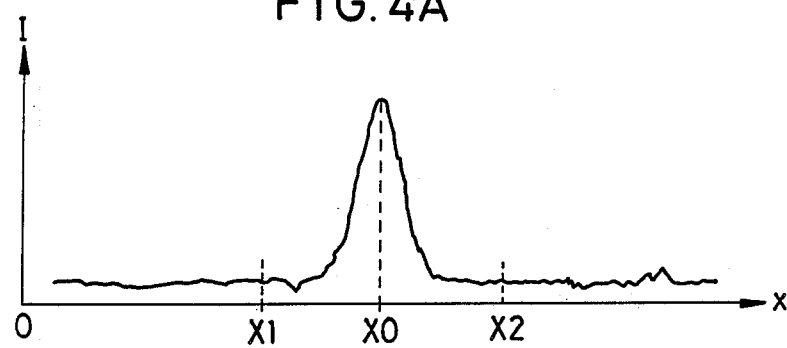
FIGS. 4A and 4B illustrate the operation of the apparatus of the present invention.
Figure 4B:
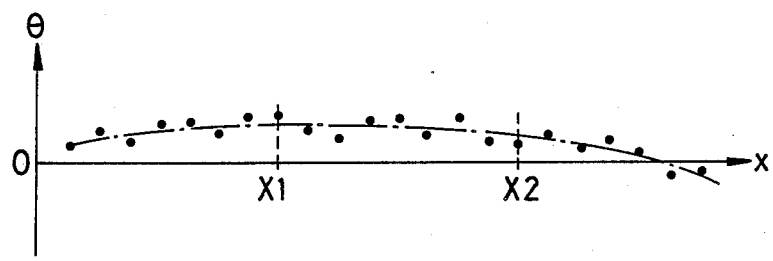

FIGS. 4A and 4B are graphs showing a mark signal wave form and an example of yawing information obtained during mark detection. The horizontal axis of FIG. 4A represents the scanning position of the stage 1 in x direction, and the vertical axis thereof represents the magnitude of the intensity of light I from the mark, and at a position $X_0$, the sheet-like beam SB and the mark WM are coincident with each other. The horizontal axis of FIG. 4B represents the scanning position of the stage 1, and the vertical axis thereof represents the angle $\theta$ measured in conformity with yawing. At step #6, the mark position $X_0$ shown in FIG. 4A is determined from the data of the intensity of light stored in the internal memory. At step #7, positions $X_1$ and $X_2$ spaced apart by predetermined distances from the position $X_0$ are determined. At step #8, the main control system 22 finds the distance difference $d_2$ or the mean value of the angle $\theta$ sampled within the range of the positions $X_1$–$X_2$. At step #9, the main control system 22 calculates the error $\Delta x$ of the detected mark position by yawing on the basis of the distance difference $d_2$ or the mean value of the angle $\theta$, and at step #10, it stores the corrected true mark position as $X_0+\Delta x$ (or $X_0-\Delta x$). This also holds true of the mark position detection in y direction. Accordingly, when the reticle 4 and the wafer 8 are to be aligned on the basis of the detected mark position, the corrected mark position $X_0+\Delta x$ (or $X_0-\Delta x$) can be used.

Now, when the mark position detection error by the yawing of the stage is to be corrected in the above-described system, the two methods mentioned below may be adopted.

One of the methods is to reset a measuring counter (usually an up-down counter) to zero after the stage 1 has been brought to any desired position, and subsequently effect yawing correction irrespective of the kinds of the marks (the fiducial mark 5 and the wafer mark WM). The zero resetting may be at such a point that the stage 1 is positioned so that the central exposed area on the wafer 8 lies at the position of the optic axis of the projection lens 3. In this case, even if at the zero-reset position, an angle $\theta$ is created in the absolute coordinates system xy by yawing, that position is relatively regarded as zero yawing. Another correcting method, as already described in connection with the prior art, is to find the angle $\theta_{65}$ by yawing occurring in the operation of detecting the fiducial mark 5 by the TTR alignment system 10 through the mark of the reticle, and effect yawing correction by the following equation with the angle $\theta_\gamma$ as the reference during the subsequent detection of the mark WM:

$$\Delta x = a \cdot \sin(\theta - \theta_{65}) \qquad (3)$$

($\theta$ is the angle when the mark WM has been detected.)

In this case, it is not necessary to reset the measuring counter in the interferometer 23 to zero, but the position in which yawing is relatively regarded as zero is limited to the time when the fiducial mark 5 has come to lie right below the optic axis of the projection lens.

In any of the above-described methods, yawing correction can be accomplished well. Also, as described in the previous embodiment, it is desirable to effect the detection of the amount of yawing a plurality of times during the operation of detecting the mark position and take the average thereof. This is because in the case of a highly accurate stage, the amount of yawing itself is originally small and thus measurement of the amount of yawing at a single location results in a great measurement error and a fluctuation of the result of the measurement with time.

Figure 6:
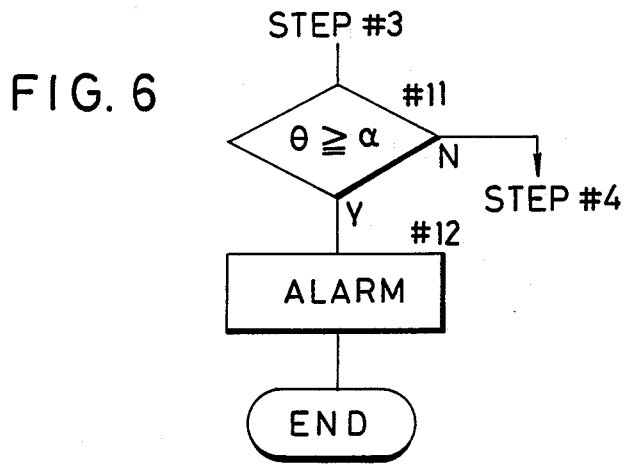
FIG. 6 is a flow chart of an improved embodiment of the present invention.

Now, since the angle $\theta$ by yawing can be sequentially measured, the reliability of the detected position information of the mark can also be judged after the detection of the mark. This function can be realized by the display device 30. This operation will now be described with reference to the flow chart of FIG. 6. The amount of yawing is measured during the mark detecting operation, and at step #11, whether the fluctuation range of the angle $\theta$ or the angle $(\theta-\theta_{65})$ found by the operator 24 is within the range of the allowed value $\alpha$ is judged by the main control system 22. When this value exceeds the tolerance, reliability is remarkably reduced even if yawing correction is directly effected and therefore, at step #12, an alarm to that effect is displayed on the display device 30.

When an alarm has been thus put out during the detection of a mark on the wafer 8, another mark situated near that mark by be detected or the amount of yawing during the detection of said mark may be interpolated from the amount of yawing during the detection of said another mark. Since the presence of the reliability of the measurement yawing can be discriminated by the display device 30 or the like, this is particularly convenient when the enhancement global alignment (hereinafter referred to as E. G. A.) of the wafer 8 is executed. The E. G. A. system is a system whereby several of the marks formed in attendance on a plurality of shot patterns on a wafer are scanned by a sheet-like beam to effect position detection and with the design positions of those measured marks as the basis, the actual arrangement coordinates of the shot patterns on the wafer in the absolute coordinates system are highly accurately specified by a mathematical statistics technique using as parameters the degree of orthogonality of the arrangement of the shot patterns, the residual rotation error of the entire wafer, the linear expansion and contraction of the entire wafer and the positional deviation (offset) of the entire wafer in the absolute coordinates system. In this E. G. A. system, it is required to detect the positions of the marks on the wafer with sufficiently high accuracy and reliability. If as in the present embodiment, the amount of yawing is measured during the operation of detecting each mark and is corrected, the capability of specifying the arrangement of the shot patterns on the wafer will be appreciably improved because the error by the yawing of the stage is not included in the mark measurement information of the E. G. A. system.

While in the above-described embodiment, the difference in the optical length between the two beams $B_1$ is detected by a single interferometer 23 to thereby find the amount of yawing two independent interferometers may be provided and the difference between measured length values found by two interferometers may be found, whereafter it may be supplied to the operator 24 to thereby find the amount of yawing. In this case, the interferometer 2 for finding the position coordinates of the stage 1 in x direction may be used also as one of the two interferometers for measuring the amount of yawing.

Now, in the above-described embodiment, the stage 1 has been scanned to detect the marks on the wafer, but a similar application can also be made in an alignment system of the type in which the sheet-like beam SB is scanned. In the system wherein the alignment beam is scanned, the wafer must be stopped during the mark detecting operation. The light information created from the wafer between the start point to the end point of the scan of the beam is detected correspondingly to the scanning position. Thereby the position of creation of the characteristic light information from the mark is found and the mark position within the scanning range is determined. However, when yawing is occurring, the detected position thereof can be corrected just in the same manner as in the previous embodiment. In such an alignment system, the stage is stopped during the mark detection and therefore, in principle, a certain amount of yawing (angle) is only measured. Actually, however, due to slight vibration of the stage, sway of the air, etc., the measured value of the amount of yawing may sometimes fluctuate with time. So, the amount of yawing measured while the mark is detected by the sheet-like beam may be averaged in the same manner as previously described. Of course, the time of beam scan is very short and therefore, the measurement of yawing may be effected only once. In this case, when the peak of the mark signal wave form exceeds a certain slice level, the amount of yawing from the interferometer 23 can be latched.

Further, an off-axis type microscope for detecting only the marks on the wafer may be used as the alignment system. In the off-axis type, a microscope is secured around the projection lens and the optic axis (or the index mark) of this microscope is brought into coincidence with the mark WM or the fiducial mark 5 on the wafer, whereafter the stage is moved by a predetermined distance (base-line) to thereby accomplish alignment of the reticle and the shot patterns on the wafer. In this off-axis type, the detected position of the mark becomes greatly spaced apart from the length measuring axis of the interferometer 2 for measuring the coordinates (the optic axis of the projection lens) and the Abbe error also becomes great. Therefore, the error of the detected mark position by the yawing of the stage is also great, and making correction as in the present embodiment is very effective. Usually, the off-axis type alignment system is used for wafer global alignment, but it has also been proposed to use it when detecting the marks attendant to the shot patterns on the wafer.

Figure 7:
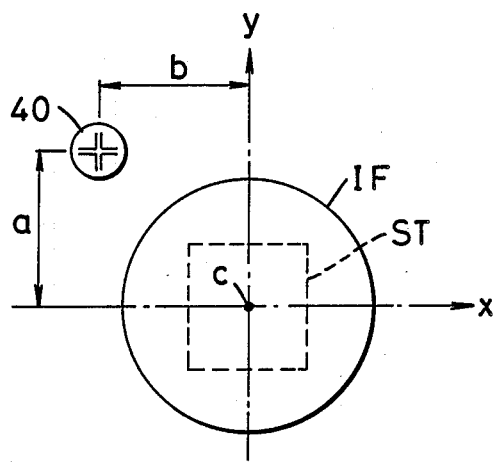
FIG. 7 illustrates another improved embodiment of the present invention.

Now, as shown in FIG. 2A, in the present embodiment, the detected position of the mark for x direction is determined to the position of the sheet-like beam SB, i.e., a point spaced apart on the y length measuring axis by a from the x length measuring axis and therefore, the error by yawing is dominant in x direction and the error in y direction can be neglected. However, where the arrangement as shown in FIG. 7 is adopted, for example, in the off-axis type and moreover the two-dimensional position of the mark is detected by the microscope 40, it is necessary to effect correction of yawing for both of x direction and y direction. In FIG. 7, the mark detection center by the microscope 40 is spaced apart by a from the x length measuring axis and by b from the y length measuring axis. When a two-dimensionally-shaped mark, for example, a cruciform mark, is to be detected by the microscope 40, with the amount of yawing during the mark detecting operation as the angle $\theta$, the error with respect to x direction is found by $\Delta x = a \cdot \sin\theta$ (or $\Delta x = a \cdot \sin(\theta - \theta_{65})$) and the error with respect to y direction is found by $\theta y = b \cdot \sin\theta$ (or $\theta y = b \cdot \sin(\theta - \theta_{65})$), and correction can be made so that $(X_s - \Delta x, Y_s - \Delta Y)$ may be the true mark position relative to the coordinates position $(X_s, Y_s)$ of the stage when the cruciform mark has been detected.

What has been described also applies to the TTL type other than the off-axis type, and the error by yawing is also corrected when one alignment system of the TTL type effects two-dimensional mark position detection.

The apparatus according to the present invention can also equally be applied to the case as disclosed in U.S. Pat. No. 4,629,313 wherein a photoelectric element with a slit is provided on a stage instead of the fiducial mark 5 and the stage is moved so that the image of the slit-like mark pattern provided around the reticle 4 by the projection lens 3 is scanned by the photoelectric element, and the projected position of the reticle 4 in the coordinates system xy is detected on the basis of the photoelectric output of the photoelectric element.

This photoelectric element with a slit can also be used for calibration of the mark detection center of the off-axis type alignment system, and again in this case, correction of yawing can be effected.

Also, a transmission type slit may be provided instead of the fiducial mark 5 and may be illuminated from the back thereof to thereby provide a light-emitting slit. This light-emitting slit can be widely used for alignment of the reticle, check-up of the optical characteristics (distortion, etc.) of the projection lens, etc.

In various check-up operations using the photoelectric element with a slit or the light-emitting slit as described above, the slit runs about in the projected image surface and therefore, by effecting the error correction by yawing according to the present invention, base line check-up, reticle alignment check-up, check-up of the distortion of the projection lens, etc. are accomplished with very high accuracy.

As described above, according to the present invention, the error of the detected mark position by the yawing of the moving means such as the stage can be made small and therefore, it becomes possible to dispose the mark detecting system for alignment in spaced apart relationship with the length measuring axis of the interferometer or the like, and this leads to the advantage that the degree of freedom of designing of the apparatus increases. Also, it becomes possible to greatly alleviate the need for reducing the yawing of the stage, and the reduced price of the apparatus by the reduced manufacturing cost can be expected.

We claim:
1. An exposure apparatus for exposing a pattern on a substrate to be exposed having a predetermined mark formed thereon, including
   a) stage means for supporting said substrate to be exposed thereon;

b) moving means capable of moving said stage means in a direction along a predetermined surface;

c) mark detecting means for applying a light beam to said substrate to be exposed and detecting said predetermined mark;

d) position detecting means for outputting a position signal conforming to the position of said stage means on said predetermined surface;

e) producing means for detecting information regarding rotation of said stage means along said predetermined surface and producing an information signal; and f) correcting means for correcting on the basis of said information signal said position signal when said mark detecting means detects said predetermined mark.

2. An exposure apparatus according to claim 1, wherein said mark detecting means detects said predetermined mark by reflection of said light beam therefrom, and said moving means moves said stage means in a predetermined direction when said mark detecting means detects said predetermined mark.

3. An exposure apparatus according to claim 2, wherein said information signal is indicative of the amount of yawing of said stage means.

4. An exposure apparatus according to claim 3, wherein said producing means produces said information signal a plurality of times during the movement of said stage means when said mark detecting means detects said predetermined mark, and said correcting means prescribes an area of the position of said stage means in said predetermined direction including the position when said mark detecting means detects said predetermined mark, and calculates in said prescribed area the mean value of a plurality of amounts of yawing conforming to said information signal which is produced a plurality of times by said producing means when said stage means is in said prescribed area.

5. An exposure apparatus according to claim 4, wherein said correcting means corrects on the basis of said mean value the position signal conforming to the position when said mark detecting means detects said predetermined mark.

6. An exposure apparatus according to claim 1, wherein said stage means has a reflecting member provided so as to intersect said predetermined direction, and said producing means applies two light beams parallel to each other to said reflecting member.

7. An exposure apparatus according to claim 6, wherein said reflecting member extends along said surface in a direction substantially perpendicular to said predetermined direction, and said producing means applies said two light beams to said reflecting member so that said two light beams are substantially parallel to said predetermined direction and are spaced apart along said surface in a direction substantially perpendicular to said predetermined direction.

8. An exposure apparatus according to claim 7, wherein said producing means produces said information signal on the basis of interference between said two light beams reflected by said reflecting member.

9. An exposure apparatus according to claim 8, wherein said producing means detects a difference between optical paths of said two light beams from a predetermined position to said reflecting member, and produces said information signal on the basis of said detected difference.

10. An apparatus including:

a) stage means for supporting an object to be examined thereon;

b) moving means for moving said stage means in a predetermined direction;

c) position detecting means for detecting the position of said stage means in said predetermined direction and outputting a position signal conforming to said detected position;

d) producing means for detecting information regarding rotation of said stage means in a predetermined plane containing said predetermined direction and producing an information signal; and e) correcting means for correcting said position signal on the basis of said information signal.

11. An apparatus according to claim 10, wherein said producing means produces said information signal a plurality of times during the movement of said stage means along said predetermined direction by said moving means, said information signal is indicative of the amount of rotation of said stage means in said predetermined plane, and said correcting means calculates the mean value of a plurality of amounts of rotation conforming to said information signal.

12. An apparatus according to claim 11, wherein said correcting means corrects said position signal on the basis of said calculated mean value.

13. An apparatus according to claim 10, wherein information signal is indicative of the amount of yawing of said stage means.

14. An apparatus according to claim 13, further including means for detecting and warning that the amount of yawing indicated by said information signal has exceeded a predetermined range.

15. An apparatus according to claim 10, wherein said stage means has a reflecting member provided so as to intersect said predetermined direction, and said producing means applies two light beams parallel to each other to said reflecting member.

16. An apparatus according to claim 15, wherein said reflecting member extends along said surface in a direction substantially perpendicular to said predetermined direction, and said producing means applies said two light beams to said reflecting member so that said two light beams are substantially parallel to said predetermined direction and are spaced apart along said surface in a direction substantially perpendicular to said predetermined direction.

17. An apparatus according to claim 16, wherein said producing means produces said information signal on basis of the interference between said two light beams reflected by said reflecting member.

18. An apparatus according to claim 17, wherein said producing means detects a difference between optical paths of said two light beams from a predetermined position to said reflecting member, and produces said information signal on the basis of said detected difference.

* * * * *